United States Patent
Miner et al.

(10) Patent No.: US 7,627,797 B2
(45) Date of Patent: *Dec. 1, 2009

(54) TEST ACCESS PORT

(75) Inventors: David E. Miner, Chandler, AZ (US); Steven J. Tu, Phoenix, AZ (US); Scott W. Murray, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 99 days.

This patent is subject to a terminal disclaimer.

(21) Appl. No.: 11/477,837

(22) Filed: Jun. 29, 2006

(65) Prior Publication Data

US 2006/0248426 A1 Nov. 2, 2006

Related U.S. Application Data

(63) Continuation of application No. 09/746,676, filed on Dec. 22, 2000, now Pat. No. 7,139,947.

(51) Int. Cl.
*G01R 31/28* (2006.01)
(52) U.S. Cl. .................................... 714/726
(58) Field of Classification Search ................ 714/726, 714/724, 733, 734, 30, 725; 716/4
See application file for complete search history.

(56) References Cited

U.S. PATENT DOCUMENTS

| | | | |
|---|---|---|---|
| 5,388,265 A * | 2/1995 | Volk | 713/322 |
| 5,448,576 A | 9/1995 | Russell | |
| 5,644,580 A | 7/1997 | Champlin | |
| 5,809,036 A | 9/1998 | Champlin | |
| 5,862,152 A * | 1/1999 | Handly et al. | 714/727 |
| 6,115,763 A | 9/2000 | Douskey et al. | |
| 6,134,675 A | 10/2000 | Raina | |
| 6,223,315 B1 | 4/2001 | Whetsel | |
| 6,282,636 B1 | 8/2001 | Yeh et al. | |
| 6,311,302 B1 | 10/2001 | Cassetti et al. | |
| 6,324,662 B1 | 11/2001 | Haroun et al. | |
| 6,378,090 B1 * | 4/2002 | Bhattacharya | 714/724 |
| 6,381,717 B1 * | 4/2002 | Bhattacharya | 714/724 |
| 6,385,749 B1 | 5/2002 | Adusumilli et al. | |
| 6,408,413 B1 | 6/2002 | Whetsel | |
| 6,412,062 B1 | 6/2002 | Xu et al. | |
| 6,425,100 B1 * | 7/2002 | Bhattacharya | 714/724 |
| 6,658,615 B2 | 12/2003 | Whetsel | |
| 6,686,759 B1 | 2/2004 | Swamy | |

(Continued)

OTHER PUBLICATIONS

U.S. Appl. No. 10/726,923, filed Dec. 2003, Nguyen et al.

(Continued)

*Primary Examiner*—Phung M Chung
(74) *Attorney, Agent, or Firm*—Blakely, Sokoloff, Taylor & Zafman LLP

(57) ABSTRACT

A method, apparatus, and system are provided for testing multi-core processors. The testing includes a test control mechanism and a multi-core processor including a set of cores with at least one core having a test access port controller (TAPC), distributed data, and a set of distributed control registers. The multi-core processor and the test control mechanism further having a configuration to provide testing the multi-core processor. The test control mechanism is modified to simultaneously test multiple cores.

23 Claims, 8 Drawing Sheets

U.S. PATENT DOCUMENTS

| | | |
|---|---|---|
| 6,701,474 B2 | 3/2004 | Cooke et al. |
| 6,711,707 B2 | 3/2004 | Haroun et al. |
| 6,918,057 B1 | 7/2005 | Brophy et al. |
| 7,003,707 B2 | 2/2006 | Whetsel |
| 7,055,060 B2 | 5/2006 | Nguyen et al. |
| 2002/0116438 A1 | 8/2002 | Nguyen et al. |
| 2002/0138695 A1 | 9/2002 | Beardsley et al. |
| 2003/0005380 A1 | 1/2003 | Nguyen et al. |
| 2004/0015669 A1 | 1/2004 | Edirisooriya |
| 2004/0111566 A1 | 6/2004 | Edirisooriya |
| 2004/0153611 A1 | 8/2004 | Jamil et al. |
| 2006/0112238 A1 | 5/2006 | Jamil et al. |
| 2006/0136925 A1 | 6/2006 | Nguyen et al. |

OTHER PUBLICATIONS

"IEEE Standard Test Access Port and Boundary-Scan Architecture", *IEEE Std. 1149.1-1990*, (1993), 86 pgs.

* cited by examiner

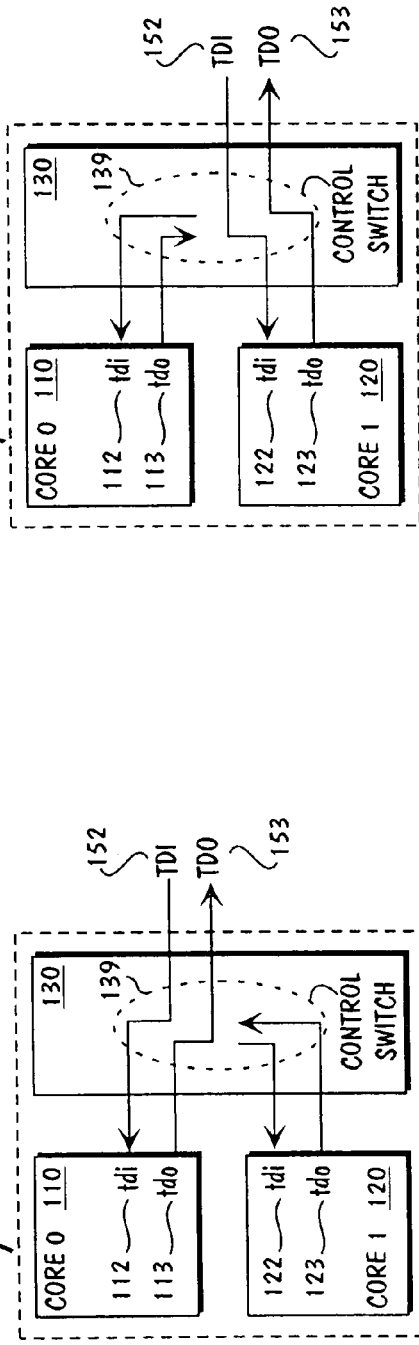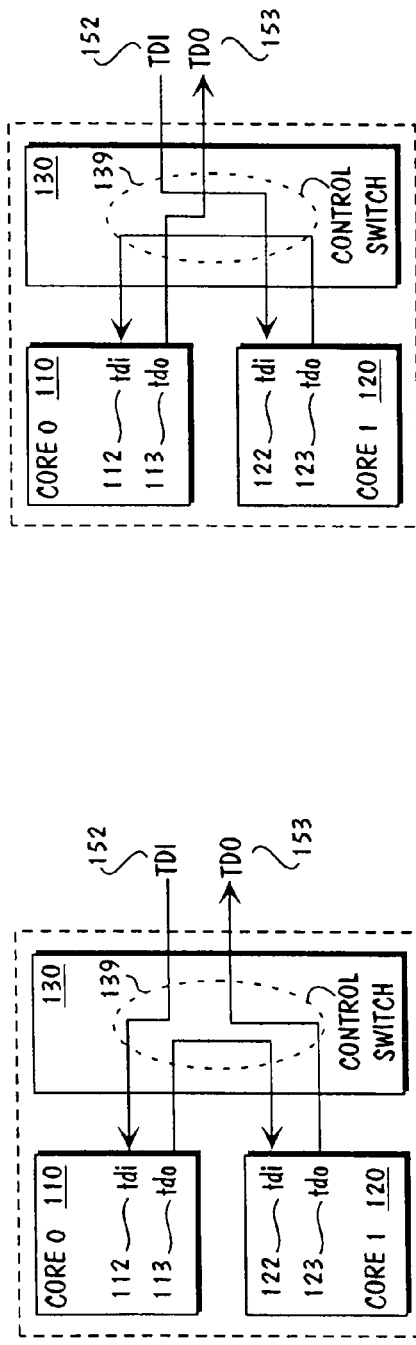

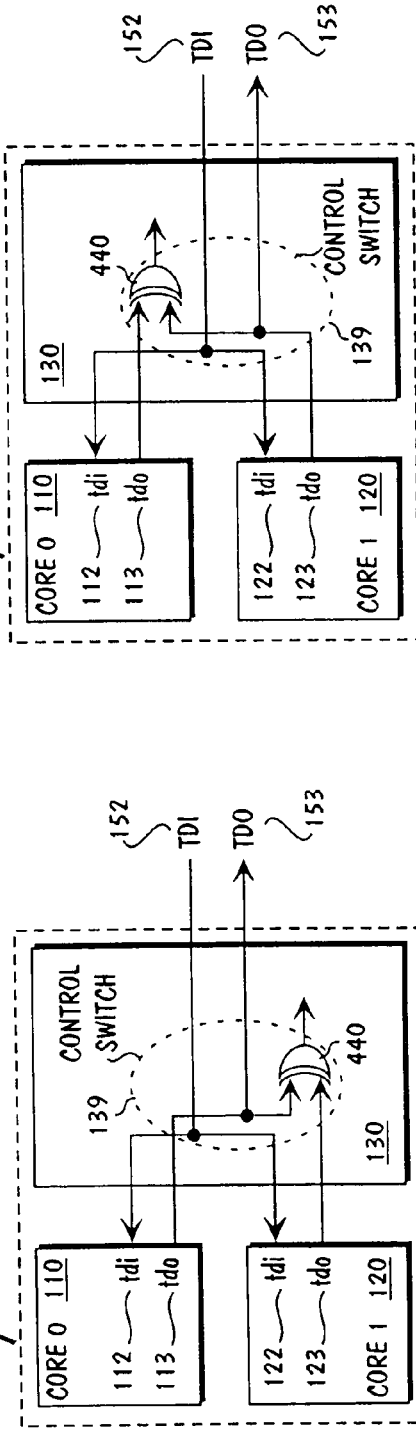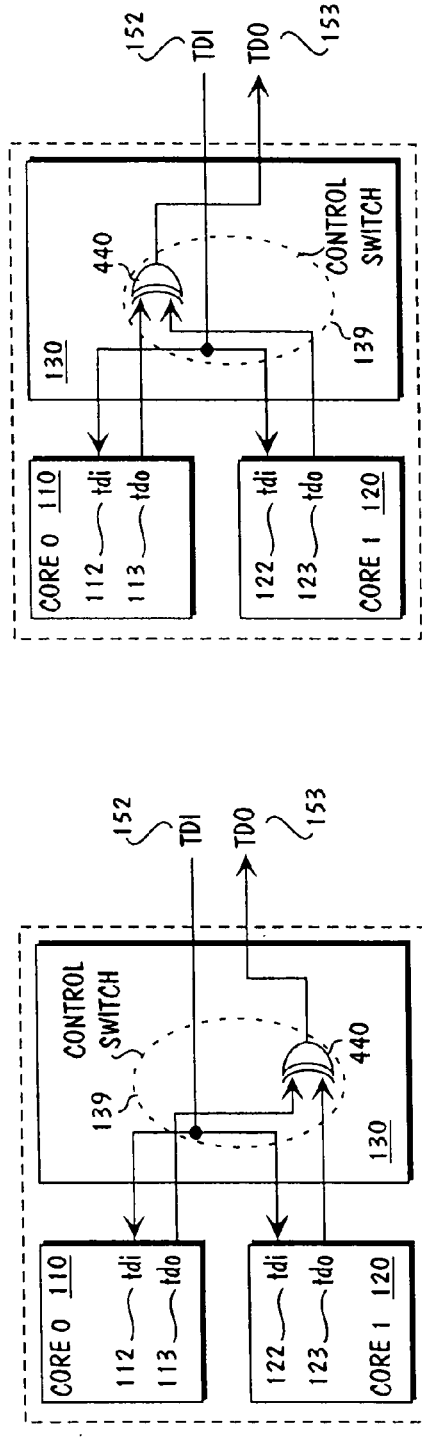

INTEGRATED TEST BUS

TAP CORE CONFIGURATION REGISTER though also may be practiced with some modifications and alterations. Thus, the descriptions and illustrations are to be regarded as illustrative in nature, and not as restrictive.

TEST ACCESS PORT

RELATED APPLICATION

This is a continuation patent application of patent application Ser. No. 09/746,676, now U.S. Pat. No. 7,139,947, filed on Dec. 22, 2000, now U.S. Pat. No. 7,139,947 titled "Test Access Port," by Miner et al., assigned to the assignee of the present invention and herein incorporated by reference.

BACKGROUND

1. Field

This disclosure relates to the testing of multi-core processors.

2. Background Information

A Test Access Port (TAP) typically comprises a 4 or 5-pin serial test interface that is compliant with the IEEE 1149.1 specification. *IEEE Standard Test Access Port and Boundary-Scan Architecture*, IEEE Std 1149.1a-1993. It may be used as an access mechanism to implement a boundary scan architecture, as well as other test modes employed to implement the Design For Testability (DFT) methodology on a given integrated circuit (IC). Traditional microprocessor designs have employed a TAP as a mechanism for testing.

A TAP typically has multiple uses. For example, when testing a chip, it is used in a test and manufacturing environment to help debug the chip. As another example, in a system environment, a TAP is used to perform board level interconnect testing between two or more board level components.

As the trend towards higher integration on a given piece of silicon continues, a new class of microprocessors, multi-core microprocessors, have appeared. Traditional microprocessors typically include a block of circuitry which substantially includes the core functions of the processor (hereafter, the "processor core") and one or more circuit blocks which substantially contain non-core functions, such as, for example, comprising cache, front side bus logic, pads, etc. (hereafter, the "non-processor core" or "non-core"). In contrast, multi-core processors may contain or include a plurality of processor cores and one or more non-processor cores.

Typically, the processor core houses a TAP for the processor. By substantially duplicating the processor core on the integrated circuit (IC), the number of TAPs will, therefore, be increased in this situation. This would potentially increase the number of pins for the IC package. In addition, there may potentially be increases in test time and test vector depth, in order to test each processor core independently. A need, therefore, exists for an improved apparatus or method for implementing an IEEE 1149.1 compliant test access port for a multi-core IC processor.

BRIEF DESCRIPTION OF THE DRAWINGS

The subject matter regarded as the invention is particularly pointed out and distinctly claimed in the concluding portions of the specification. The invention, however, both as to organization and the method of operation, together with objects, features and advantages thereof, may be best understood by a reference to the following detailed description when read with the accompanying drawings in which:

FIG. 3 is a four-part diagram illustrating an embodiment of multiple couplings of a test access port (TAP) in accordance with the invention.

FIG. 4 is a four-part diagram illustrating an embodiment of a test access port (TAP) in accordance with the invention.

DETAILED DESCRIPTION

Figure 1:
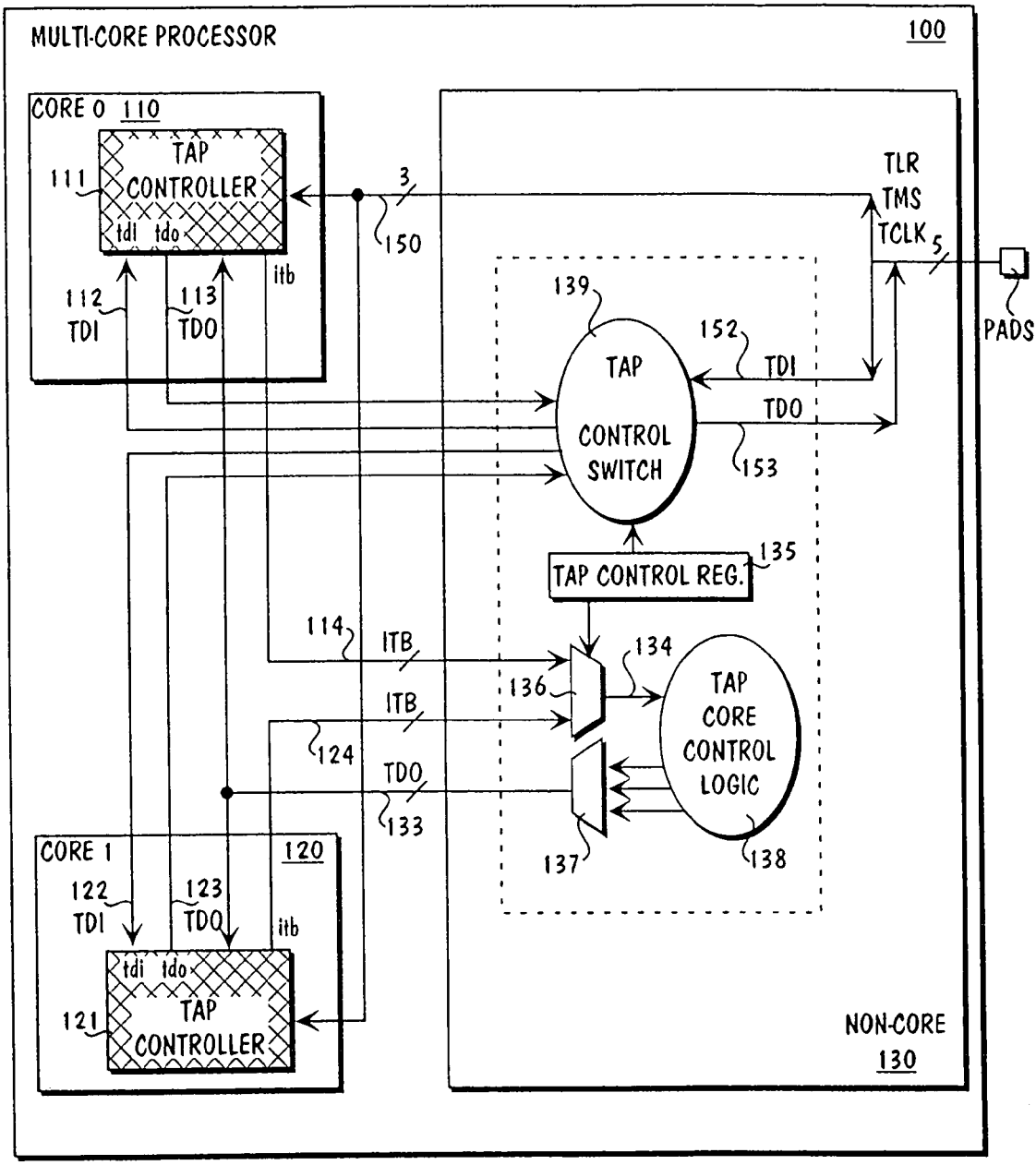
FIG. 1 is a diagram illustrating an embodiment of a test access port (TAP) in accordance with the invention.

In the following detailed description, numerous details are set forth in order to provide a thorough understanding of the present invention. However, it will be understood by those skilled in the art that the present invention may be practiced without these specific details. In other instances, well-known methods, procedures, components, and circuits have not been described in detail so as to not obscure the present invention.

To provide a context for the invention, a Test Access Port (TAP) typically comprises a 4 or 5-pin serial test interface that is compliant with the IEEE 1149.1 specification. It may be used as an access mechanism to implement the boundary scan architecture, as well as other test modes typically employed to implement the Design For Testability (DFT) methodology on a given integrated circuit. Traditionally, microprocessor designs have employed a TAP as a mechanism for testing.

A TAP, in accordance with the IEEE 1149.1 specification, is employed by a large number of integrated chip designers and manufacturers. One of the purposes of a TAP is to facilitate testing of an integrated circuit. For example, a board manufacturer, attempting to verify that their board's components are properly coupled, may couple a number of the board's integrated chips' TAPS into a serial chain and shift data through that chain. This procedure is frequently referred to as 'boundary-scan', because data is scanned across the pin boundary of the board's integrated chips.

In another example, an integrated circuit designer may, as an example, wish to adjust the speed of the circuit's clock during specific logic stages. While the IEEE 1149.1 specification does not contain a specification regarding this form of testing, in order for the integrated circuit designer to accomplish this, one may, as one of many possible design choices, leverage the TAP specification to allow access to this test feature. Instructions substantially regulating the speed and timing of the clock may be scanned or shifted into the integrated circuit via the TAP. An integrated circuit designer may leverage a test access port that is substantially IEEE 1149.1 compliant to facilitate a variety of testing features, of which the above is merely one possible example.

The IEEE 1149.1 standard specifies a possible 4 pin interface which may be utilized to allow test instructions and associated test data to be fed into a component and, subsequently, may allow the results of execution of such instructions to be read out of the component. For testing features enumerated in the IEEE 1149.1 specification, information is communicated in a serial format. However, additional testing features that utilize a test access port, which is substantially IEEE 1149.1 compliant, may not be restricted in this fashion.

An IEEE 1149.1 compliant test access port includes the following 4-pin interface:

Test Clock (TCLK) acts as the clock signal for the test access port;

Test Mode Select (TMS) controls the TAP Finite-State Machine (FSM); The TMS pin may be sampled by the FSM every TCLK and is utilized in the determination of whether to or how to change or retain the state of the FSM;

Test Data In (TDI) provides the input of serial movement of test data through the circuit;

Test Data Out (TDO) provides the output of serial movement of test data through the circuit.

The IEEE 1149.1 standard details an optional, but frequently implemented, fifth interface pin, Test-Logic-Reset (TLR). The TLR pin may be used to reset the TAP's FSM to a known state.

Figure 8:
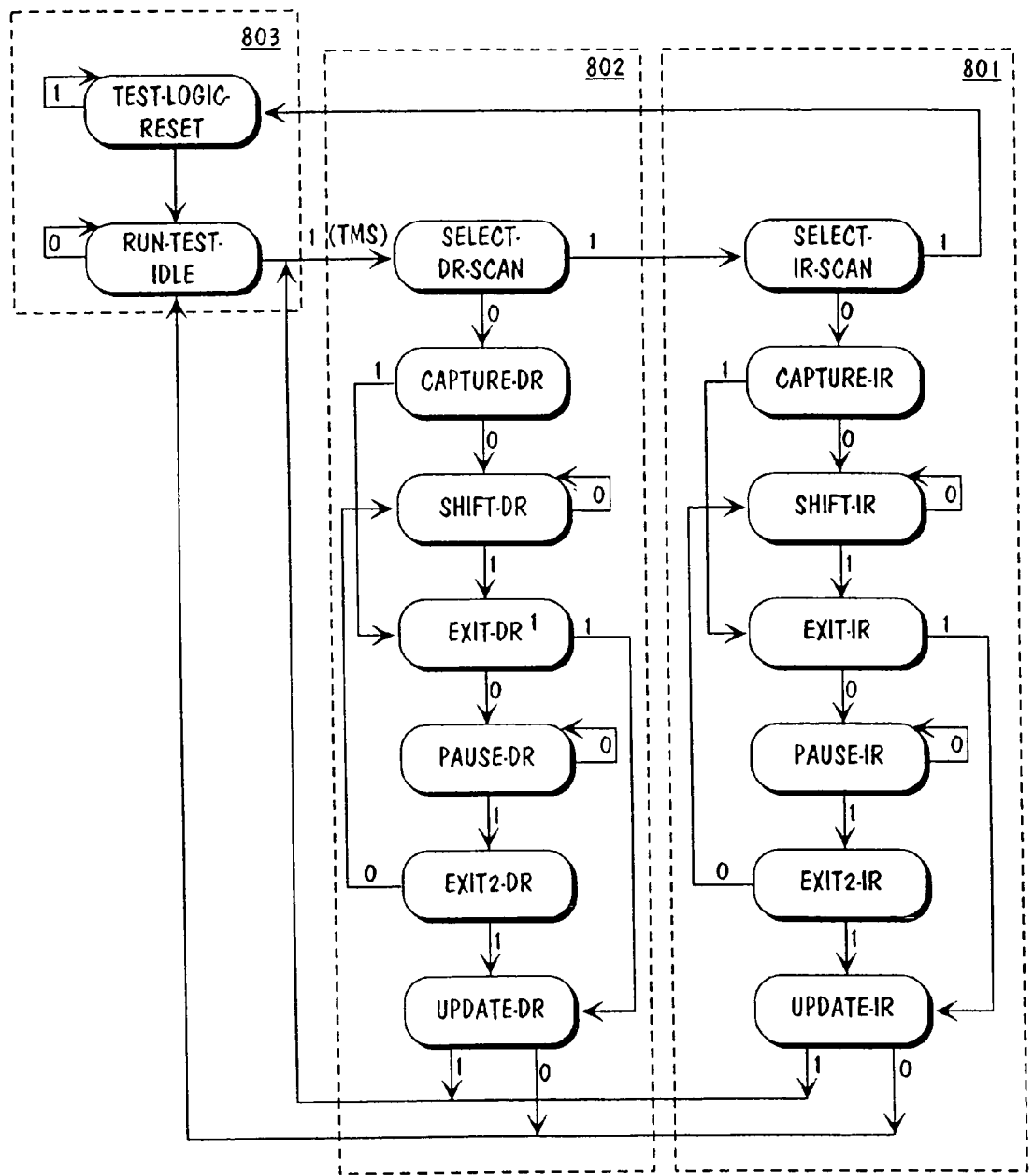
FIG. 8 is a state diagram illustrating an embodiment of a test access port (TAP) finite-state machine (FSM) in accordance with the IEEE 1149.1 specification.

A Test Access Port Controller (TAPC) usually controls the interaction between the TAP's 4-pin serial interface and the circuit's testing features. A TAPC may control this interaction based on the current state of a TAP's 16-state FSM and the active instruction in the TAP's Instruction Register. FIG. 8 shows a TAP FSM as detailed in section 5.1, TAP Controller State Diagram, of the IEEE 1149.1 specification. Such a FSM may be conceptually divided into 3 main parts. State grouping 801 allows access to the TAP's Instruction Register. State grouping 802 allows access to the variety of data and control registers possibly utilized in the implementation of any test features accessible by the circuit's TAP. State grouping 803 includes a state which may reset the TAP to a known state and a state which may, depending on the test feature's implementation, place the TAP in an idle state.

In addition to the state of the FSM, access to a TAP's data and control registers is conditioned on the active instruction in the TAP's Instruction Register. The Instruction Register (IR) may be accessed when the TAP FSM is placed in one of the states in state grouping 801. In state grouping 801 an instruction may be shifted into the Instruction Register. In an IEEE 1149.1 compliant TAP, an instruction usually places one data or control register serially between the TDI and TDO pins. A single register may be selected by multiple instructions depending on the design of the IC's particular TAP.

Figure 9:
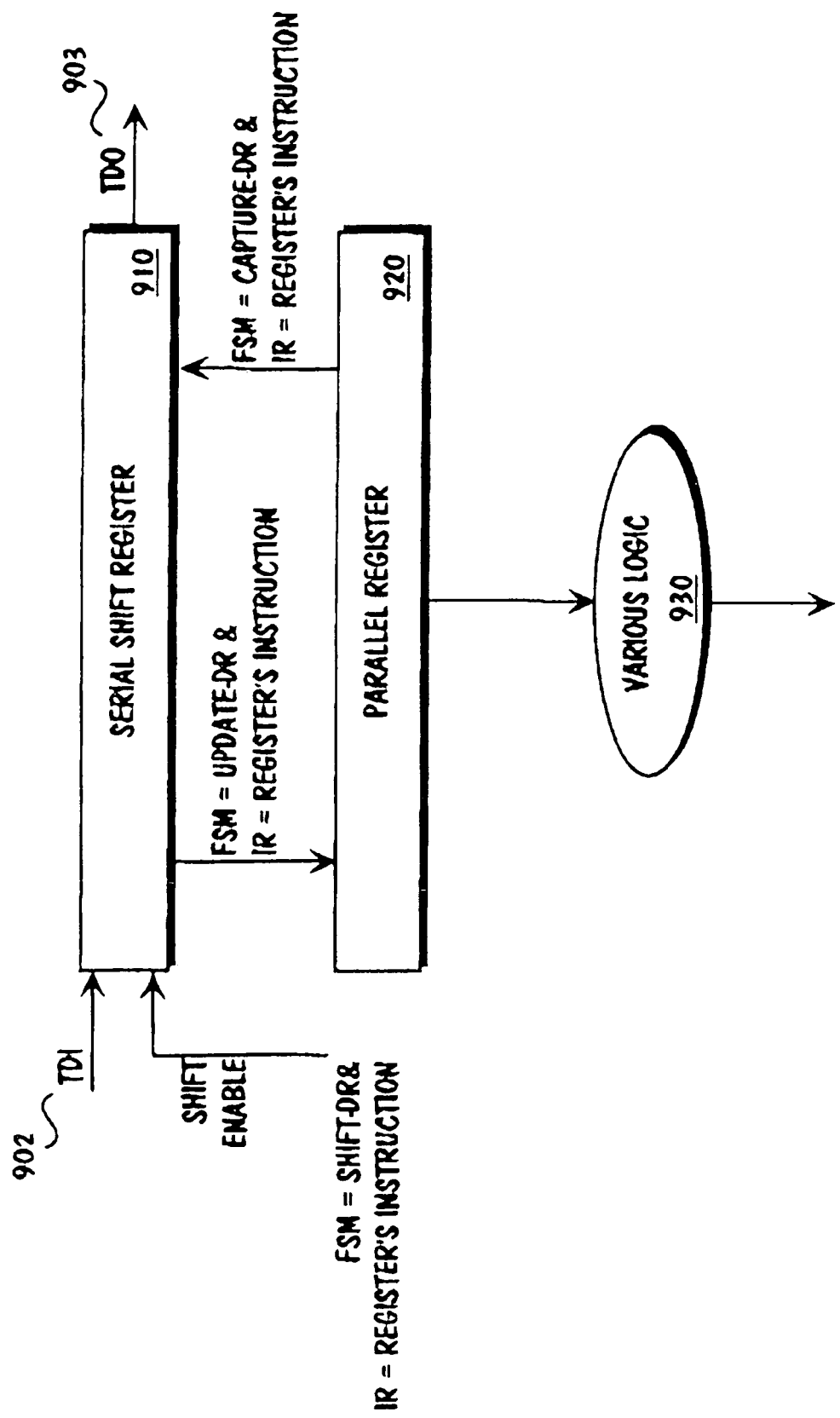
FIG. 9 is a diagram illustrating an embodiment of a test access port (TAP) data register in accordance with the IEEE 1149.1 specification.

Generally, but not always, a TAP's data and control registers contain both a serial and parallel component, as seen in FIG. 9. However, a register may deviate from this norm in order to accomplish specific testing or implementation goals as the designers see fit. Once an instruction, that activates a particular register, has been shifted into the TAP, the register may be affected by the TAP FSM states in grouping 802.

Below is an illustrative example of a basic access of a data or control register. However, due to special testing or implementation goals, a TAP may incorporate additional actions that may or may not occur during the operation of a TAP. The following is merely one possible example, of the operation of a sample TAP and is not intended to limit the scope of the invention or to represent the operation of all TAPs included within the scope of the present invention.

When in the CAPTURE-DR state, an active register may normally load, in a parallel method, the contents of its parallel component into its serial component. It is normally said that the parallel component is being "read" or "captured." When in the SHIFT-DR state, an active register may serially shift data from TDI to TDO across its serial component. During this time, the parallel register will generally not be affected. When in the UPDATE-DR state, an active register may normally load, in a parallel fashion, the contents of its serial component into its parallel component. It is normally said that the parallel component is being "written to" or "updated."

The IEEE 1149.1 specification details the base level of functionality for a TAP, however, integrated chip (IC) designers frequently add additional functionality to a TAP. This additional functionality may, for example, address certain testing aspects of the IC, be hidden from the customer or board manufacturer, allow access to non-test related functions of the IC, etc.

Typically, the TAPC and the plurality of data and control registers are placed together in a particular location on the IC. However, some registers, for example those dealing with scan testing, are dispersed throughout the chip. In addition, it may be desirable for the TAPC to communicate with other functional units blocks (FUBs) on the IC, e.g. floating-point unit, instruction fetch unit, memory, etc. This dispersion may at times create a large number of control signals, which may radiate from the TAPC to the dispersed registers. Because ICs have a limited amount of space for routing signals, dedicating a large portion of this routing space to testing, instead of core functionality, may result in routing and other problems during chip design and manufacture.

Figure 5:
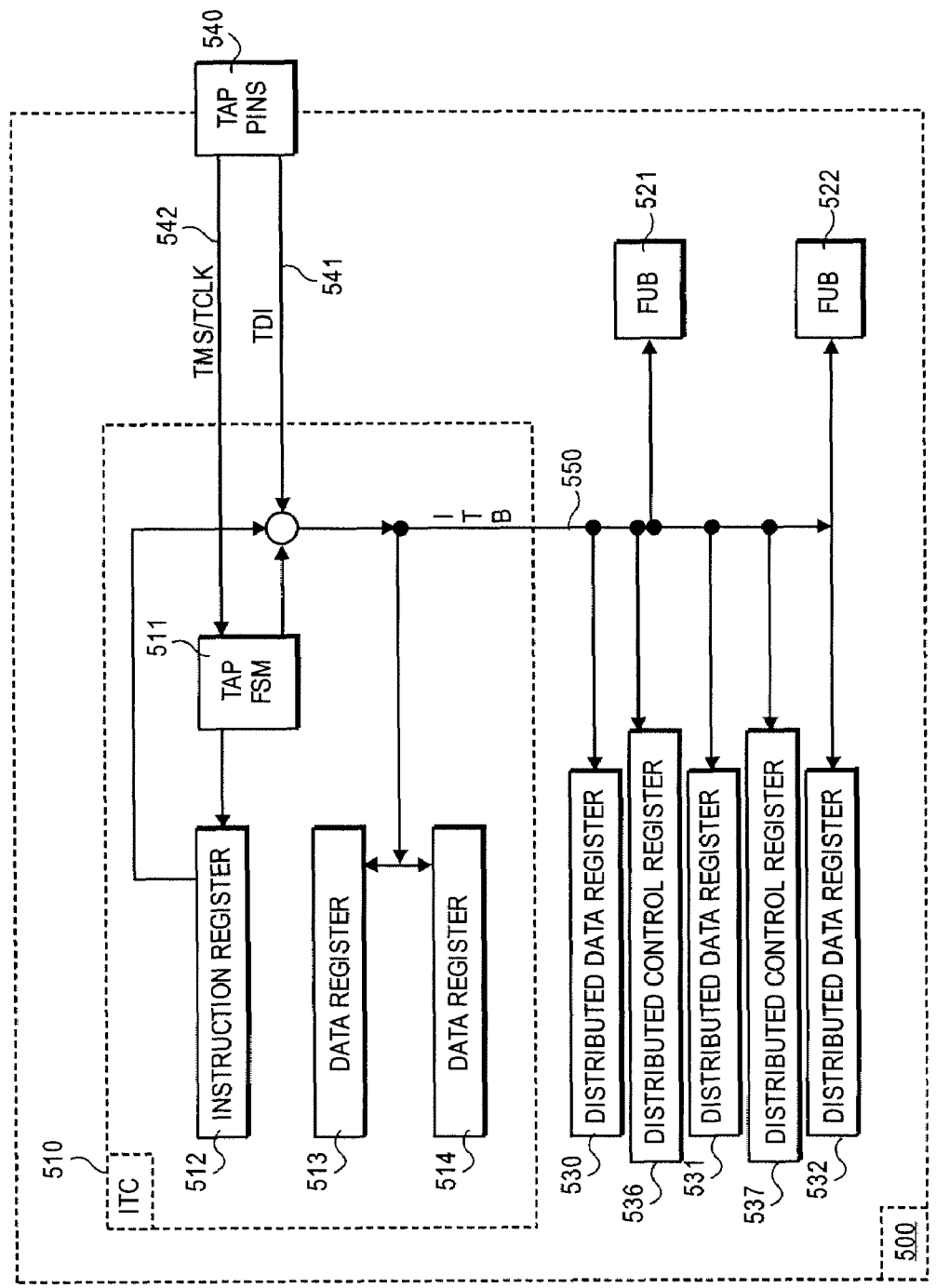
FIG. 5 is a diagram illustrating a distributed test access port (TAP) mechanism in a single core processor.

FIG. 5 is a diagram illustrating a distributed test access port mechanism implemented in a single-core processor. The Integrated TAP Controller (ITC) 510, which may include the TAPC and some data and control registers, may be coupled to distributed data registers 530-532, and distributed control registers 536 and 537, and/or FUBs 521 & 522 via Integrated Test Bus (ITB) 550, for example. ITB 550 may comprise a grouping of data signals that allow the receiving registers and/or FUBs to locally generate control signals desired for operation, as opposed to generating the control signals directly from the TAPC.

Figure 6:
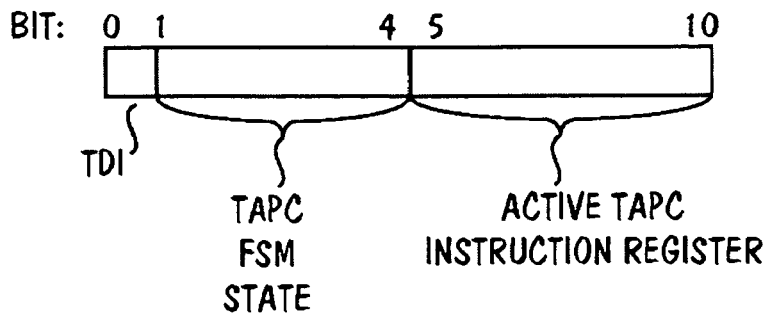
FIG. 6 is a diagram illustrating an integrated test bus (ITB) in accordance with the invention.

FIG. 6 illustrates a possible grouping of data signals that may achieve this goal. Bit 0 of ITB 550 may be a representation of the current TDI bit. Bits 1-4 may be a representation of the state of the TAP FSM. Bits 5-10 may be a representation of the active contents of the TAPC's Instruction Register, assuming the Instruction Register is 6-bits wide, however any Instruction Register width may be used. In addition, other bits may be added to ITB 550 as desired to provide information for the distributed data registers 530-532, the distributed control registers 536 and 537, and/or FUBs 521 & 522 in order to locally generate the control signals for operation. Also, the order of the bits may vary depending, at least in part, on the embodiment of the ITB.

As the trend towards higher integration on a given piece of silicon continues, a new class of microprocessors, multi-core microprocessors, have appeared. Conventional microprocessors typically include a block of circuitry which substantially includes the core functions of the processor (hereafter, the "processor core") and one or more circuit blocks which substantially include non-core functions, possibly comprising cache, front side bus logic, pads, etc. (hereafter, the "non-processor core" or "non-core"). In contrast, multi-core processors may include a plurality of processor cores and one or more non-processor cores.

Typically, the processor core houses the TAP controller of the processor. Substantially duplicating the processor core on the integrated circuit (IC) will, therefore, increase the number of TAP controllers. This, increase in the number of processor cores, may potentially increase the number of pins employed on the IC package, as well as potentially increase the test time and the test vector depth utilized to test multiple processor cores. In addition, if it is desired that a multi-core processor be a "plug-in" replacement for a single-core processor, the pin out of the multi-core processor should substantially match the pin-out of the single-core processor. Therefore, the number of pins for TAP access on a multi-core processor may be limited to the number of pins on the single-core processor. A need, therefore, exists for an improved apparatus or method for implementing an IEEE 1149.1 compliant test access port for a multi-core processor.

A technique for providing a improved IEEE 1149.1 compliant test access port for a multi-core processor may include: providing a TAPC on at least two processor cores, providing a TAP configuration register in the non-processor core, coupling the multiple core TAPCs and the non-processor core configuration register such that one of multiple routing and control configurations may be dynamically selected during operation. Such a device may reduce the number of pins employed on the IC package, and provide opportunities for reducing the number of testing vectors and time utilized to test the multi-core device. In addition, such a device may allow a multi-core processor to be "plug-in" compatible with a single-core processor.

In light of the above illustrative context for the invention, it may be understood that FIG. 1 is a block diagram illustrating an embodiment of a multi-core processor in accordance with the invention. Embodiment 100 includes processor cores 110 & 120, although any number of processor cores may be used, and non-processor core 130, although any number of non-processor cores may be used. Both processor cores 110 & 120 may include TAPCs 111 & 121.

In the embodiment illustrated in FIG. 1, both TAPCs may receive identical or substantially identical TLR, TMS, and TCLK signals via bus 150. However, the invention is not limited to embodiments where all TAPCs receive identical or substantially identical TLR, TMS and TCLK signals. The TAPCs may receive fully or partially independent TLR, TMS and TCLK signals. In addition, because the TLR signal is optional under the IEEE 1149.1 specification, some or all of the TAPCs may not receive the TLR signal. These fully or partially independent signals may each have fully or partially independent external IC pin interfaces or a particular routing technique may be used internally to the IC. For example, a routing scheme similar to that used in the embodiment illustrated in FIG. 1 for the TDI and TDO signals, described below, may be employed in order to provide fully or partially independent TLR, TMS and TCLK signals. However, the invention is not limited to any particular routing scheme for these signals.

Both TAPCs 110 & 120 may produce their own TDO signals 113 & 123, which may be routed in accordance with one of many selectable configurations by TAP Control Switch 139. TAP Control Switch 139 provides a single TDO to external TDO signal 153. External TDI signal 152 may be routed in accordance with one of many selectable configurations by TAP Control Switch 139. TAP Control Switch 139 provides TAPCs 111 & 121 with independent TDIs 112 & 122. TAP Control Switch 139 may route the TDI/TDO signals using multiplexer (MUX) or demultiplexer (DeMUX) components, however, one skilled in the art will instantly recognize that a variety of electrical components may be used to perform the desired routing operation.

TAP Control Switch 139 may be controlled by TAP Core Configuration Register 135. TAP Core Configuration Register 135 may be readable and writeable by, as taught by the IEEE 1149.1 specification, serially shifting data into and out of the register with the entering bit being TDI and the exiting bit being Register TDO 133. However, a variety of access mechanisms, either compliant or non-compliant with the IEEE 1149.1 specification, may be employed in order to read and/or write to Register 135. In this embodiment, TAP Core Configuration Control Logic 138 may receive ITBs 114 & 124, one from each TAPC. Alternately, in another possible embodiment, TAP Core Configuration Control Logic 138 may receive control signals that are more detailed and specialized than the generic signals employed in ITBs 114 & 124. MUX 136 may determine which processor core has control of non-processor core 130 and supplies TAP Core Configuration Control Logic 138 with the controlling ITB, ITB 134. Of course, any grouping of components, instead of MUX 136, may be used to perform the desired routing operation.

If multiple data and control registers are employed in the non-processor core, in accordance with the IEEE 1149.1 specification, each register will provide a TDO to the TAPCs. It may be desirable to reduce the number of TDOs returned to TAPCs 111 & 121 from the non-processor core. MUX 137 may be utilized to select which of the multiple TDOs is to be returned from non-processor core 130 to TAPCs 111 & 121. Of course, any grouping of components, instead of MUX 137, may be used to perform the desired reduction operation. While the embodiment in FIG. 1 utilizes this TDO reduction the invention is not limited by supplying any particular number of TDO signals from non-processor core 130. The invention is also not limited to having only one non-processor core.

Figure 7:
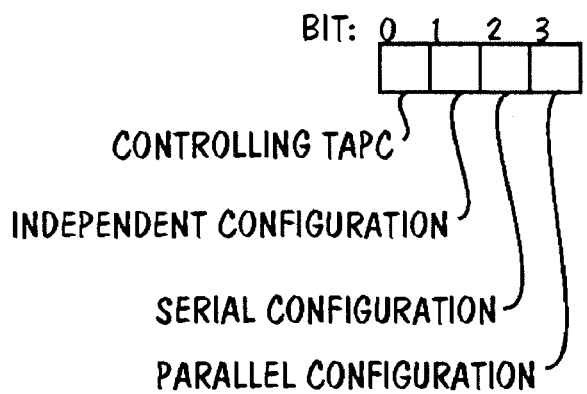
FIG. 7 is a diagram illustrating an embodiment of a TAP Core Configuration Register in accordance with the invention.

In the embodiment of the invention illustrated in FIG. 7, TAP Core Configuration Register 135 includes a bit to determine which processor-core's TAPC is allowed to control the non-processor core data and control registers, of which one is the TAP Core Configuration Register itself. Although the embodiment in FIG. 1 illustrates two processor cores, the invention is not limited to embodiments with two processor cores. More bits may be used for embodiments with more than two processor cores. By default, this bit may be set to a substantially predetermined value. The substantially predetermined value may be loaded into the register upon a predetermined event such as, but not limited to: the IC receiving the "Power Good" signal from the power supply, activation of the IC's master reset pin, activation of the IC's TLR pin, or one or more of many other possible events. This bit may be used in conjunction with MUX 136 to determine which ITB the non-processor core will use as ITB 134.

Figure 2:
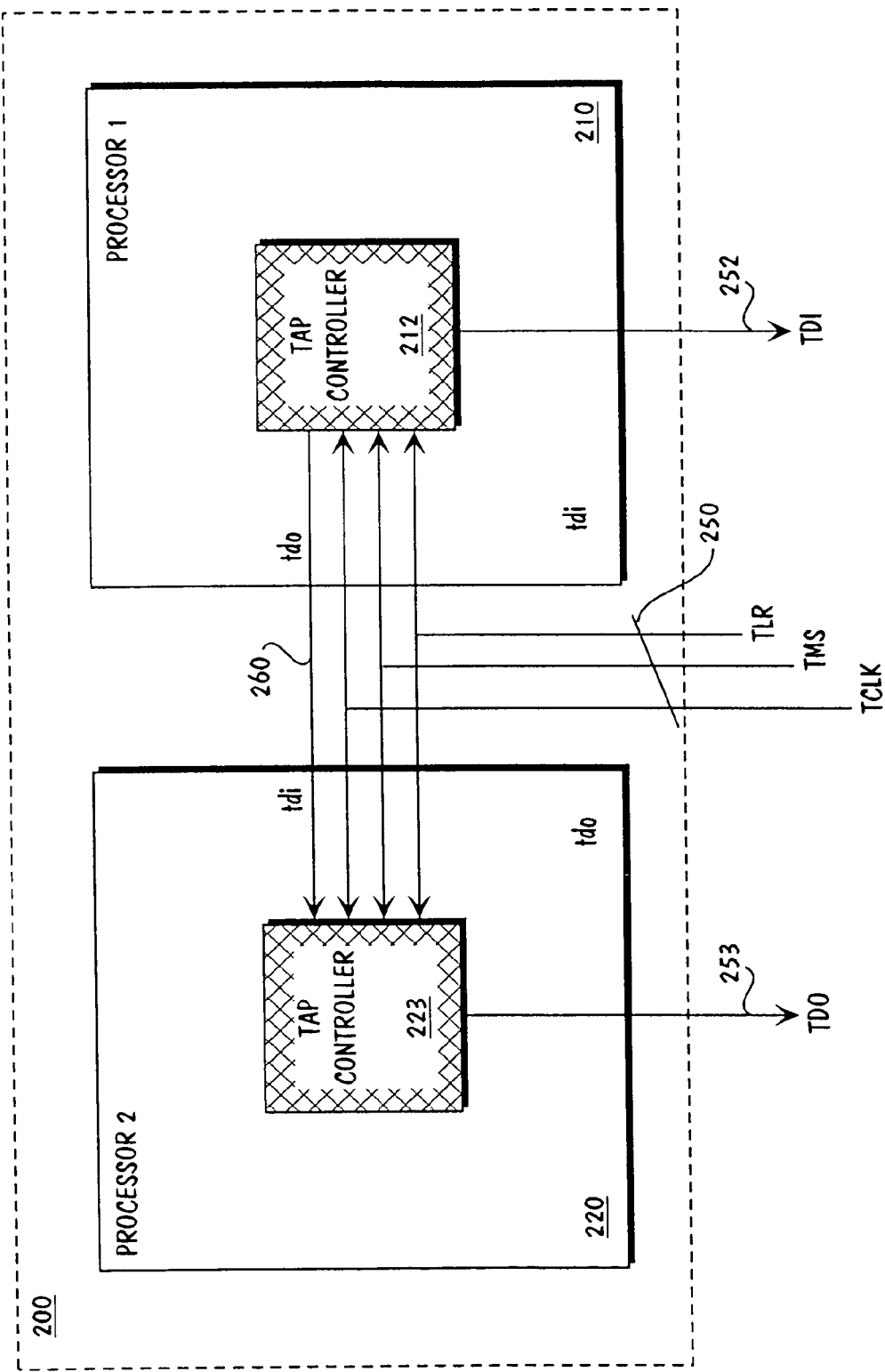
FIG. 2 is a diagram illustrating a typical configuration of a test access port (TAP) in a multiple processor configuration.

In the embodiment of the invention illustrated in FIG. 7, TAP Core Configuration Register 135 includes a number of bits to determine the routing of the processor cores' TDI and TDO signals. Possible embodiments of routing configurations are illustrated in FIGS. 3 and 4. These routing configurations may be contrasted with the traditional routing configuration used for multiple processor systems, as illustrated by FIG. 2. In a multiple processor system two or more processors, each processor including a processor-core and a non-processor core, are utilized. In traditional multi-processor TAP routing, processors 210 & 220 may receive substantially identical TLR, TMS, and TCLK signals via bus 250. Processor 210 may receive its TDI signal from the external TDI signal 252. Processor 210's TDO 212 may be daisy-chained via signal 260 to processor 220's TDI 223. Processor 220 then supplies its TDO signal to the external TDO signal 253. This allows one to shift data into either processor's TAPC. However the serial data chain, TDI 252 to TDO 253, is now effectively double that of a single processor's serial data chain. By doubling the effective length of a processor's serial data chain the amount of time to test the processor is effectively doubled.

In the embodiment of the invention illustrated in FIG. 1, TAP Core Configuration Register 135 includes a number of bits to determine the routing of the processor cores' TDI and TDO signals. These bits may control which routing configuration of TAP Control Switch 139 is selected. One skilled in the art may realize a number of ways to implement the TAP Control Switch 139. For example, MUXs may be used, however the invention is certainly not limited to this embodiment of TAP Control Switch 139, and all are included within the scope of the present invention. Particular embodiments of these routing schemes are illustrated in FIGS. 3 & 4. However, the invention is not limited to these illustrated routing schemes. The routing of external TDI 152 to external TDO 153 may involve routing the signals to the controlling TAPC's, as determined by TAP Core Configuration Register 135, the TDI/TDO signals. This may allow the multi-core processor to be accessed as if the controlling processor core existed within the IC. The non-controlling TAPC's TDI and TDO signals may be either disconnected or set to a substantially predetermined value. FIGS. 3a & 3b illustrate embodiments where external TDI 152 and external TDO 153 are routed directly to the TDI and TDO signals of the controlling processor-core's TAPC. FIG. 3a illustrates an example where processor-core 120's TAPC 111 is the controlling TAPC. FIG. 3b illustrates an example where processor-core 120's TAPC 121 is the controlling TAPC.

In the embodiments of the invention illustrated in FIG. 3c and FIG. 3d, the ability to serially daisy-chain the processor-cores' TAPs is shown. TAP Core Configuration Register 135 may be used to control the order of the processor-cores in the serial daisy-chain. FIG. 3c illustrates a routing scheme where processor-core 110 may be first in the chain and processor-core 120 last in the chain. FIG. 3d illustrates a routing scheme where the order of the processor-cores in the serial chain is reversed from that illustrated in FIG. 3c. The order of the processor-cores in the daisy chain may be determined with the aid of the control bit found in TAP Core Configuration Register 135 or the order may be determined without reference to this bit.

In contrast to FIGS. 3c & 3d, where the processor-core's serial data chains may be accessed in a serial fashion, FIG. 4 illustrates a possible routing configuration where the processor-core's serial data chains may be accessed in parallel. Once again, TAP Core Configuration Register 135 may control which of these routing configurations of TAP Control Switch 139 are selected. In this particular routing configuration, external TDI 152 is applied to the TDI signals of each processor-core's TAPC. If only one external TDO pin exists, the controlling TAPC's TDO signal may be placed on external TDO 153. FIG. 4a illustrates an embodiment where processor-core 110 is selected as the controlling TAPC and its TDO signal is placed on external TDO 153. FIG. 4b illustrates the case where processor-core 120 is selected as the controlling TAPC.

Although in these embodiments the processor-cores are substantially identical, the invention is not limited to embodiments with identical processor-cores. It may be useful to test the processor-cores in parallel and determine if the testing results are not substantially identical. To aid in this, a comparison mechanism may be used. FIG. 4 illustrates embodiments with this comparison mechanism. In FIG. 4a, exclusive OR (XOR) gate 440 compares the TDO signals from processor-cores 110 & 120. When the two TDO signals are not substantially identical, XOR gate 440 may signal that a mis-compare has occurred. Depending on which routing is selected by TAP Control Switch 139, this mis-compare signal or "error bit" may be stored in a register, placed on external TDO signal 153 or both. In an embodiment, illustrated in FIGS. 4c and 4d, where the mis-compare bit is placed onto external TDO signal 153, external TDO signal 153 may be allowed to freely change between high and low states, as determined by the state of the mis-compare bit, or may be designed to get "stuck" in a particular state once a mis-compare has occurred, referred to as a "sticky-bit." In an embodiment where the mis-compare signal is stored in a register, the embodiment may involve storing the signal in a sticky-bit register, although other storage schemes are possible. This register may then be accessed via the TAP or possibly though the processor's normal register access techniques. However, the invention is not limited to the technique used to access the register.

It is noted that, while FIGS. 1, 3 & 4 illustrate embodiments with two identical processor-cores and a single non-processor core, the invention is not limited to this embodiment. It is recognized that as the number of processor cores increases beyond two, the number of possible routing configurations that may be provided by TAP Control Switch 139 also increases. While the embodiments shown illustrate configurations where the processor-cores are accessed in exclusively independent, serial or parallel modes, as the number of processor cores increases, routing configurations that include a mix of the independent, serial and parallel modes are possible. In addition, as the number of non-processor cores increases, more routing schemes may be available. If substantially non-identical processor-cores are used, additional routing schemes may exist or illustrated routing schemes may no longer be desirable. The invention is not limited to a particular defined set of routing configurations.

While the embodiment illustrated in FIG. 1, shows an embodiment where one set of TAP pins 190 is externally visible from the IC boundary, the invention is not limited to this embodiment. A multi-core processor may include multiple sets of external TAP pins, where the number of sets of pins is equal to or less than the number of TAPCs included in the multi-core processor. As the number of sets of external TAP pins increases, the number of possible routing configurations may also increase. The invention is not limited to a particular defined number of external TAP pins.

While TAP Core Configuration Register 135 is illustrated as being a unified register, the invention is not limited to this embodiment. TAP Core Configuration Register 135 provides a variety of control functions and may, for example, be divided into smaller registers or, in another example, may be part of a larger register. In the embodiments shown, the contents of TAP Core Configuration Register 135 may be altered during TAP operation. This may allow the controlling TAPC to change during operation or the TDI/TDO routing configuration to change during operation. However, other embodiments in accordance with the invention may not allow any or some of these features to be changed during operation.

An embodiment of the invention may include a computing platform including a multi-core processor, in which the multi-core processor includes a test control mechanism, such as, in one embodiment, for example, circuit 100 in FIG. 1. In this embodiment, a computing platform may include a multi-core processor to process instructions and a memory to store instructions.

An additional embodiment of the invention may comprise a technique for testing a multi-core processor, which includes providing an indicator to identify a desired testing option. This indicator may be serially shifted into and stored in a register. Based upon the testing option selected by the provided indicator, the routing of signals between a plurality of test access ports (TAPs) may be dynamically arranged. The available testing options may involve, but are not limited to, routing the signals to allow the TAPs to operate in either a serial, parallel or independent fashion. In addition, there may be a testing option, which allows an error signal to be generated if the output of two or more TAPs is not equivalent or substantially equivalent. The dynamic arrangement the signal routing may, but is not required to, involve only arranging the routing of signals that exist externally to the processor cores of the multi-core processor.

While certain features of the invention have been illustrated and described herein, many modifications, substitutions, changes, and equivalents will now occur to those skilled in the art. It is, therefore, to be understood that the appended claims are intended to cover all such modifications and changes that fall within the true spirit of the invention.

The invention claimed is:

1. An apparatus comprising:
   at least one test control mechanism;
   a multi-core processor including a plurality of cores, wherein at least one core includes a test access port controller (TAPC), a plurality of distributed data registers and a plurality of distributed control registers; and
   said multi-core processor and said test control mechanism having a configuration so as to allow testing of said multi-core processor, said test control mechanism tests more than one core of the plurality of cores concurrently.

2. The apparatus of claim 1, wherein said multi-core processor comprises at least two processor cores and at least one circuit comprising non-processor core logic.

3. The apparatus of claim 2, wherein said at least one circuit comprising non-core logic includes said plurality of distributed data registers and said plurality of control registers.

4. The apparatus of claim 3, wherein said at least one test control mechanism is substantially compliant with the IEEE 1149.1 specification.

5. The apparatus of claim 3, wherein said TAPC, said plurality of distributed data registers, and said plurality of distributed control registers are coupled via an Integrated Test Bus (ITB).

6. The apparatus of claim 3, wherein said test control mechanism is controllable, at least in part, by one of said TAPC.

7. The apparatus of claim 6, wherein which one of said test TAPC controls said test control mechanism is dynamically selectable during operation.

8. The apparatus of claim 2, wherein at least one of the said at least two processor cores comprises a test access port (TAP) which includes said TAPC.

9. The apparatus of claim 8, wherein said test control mechanism and said at least two processor cores are coupled so as to provide multiple coupling arrangements, said multiple coupling arrangements being dynamically selectable during operation.

10. The apparatus of claim 9, wherein said multiple coupling arrangements are selected from a group consisting essentially of coupling said test access port substantially in series, coupling said test access ports substantially in parallel and coupling said test access ports for substantially independent operation.

11. The apparatus of claim 8, wherein said test control mechanism is arranged to allow at least one of said at least two processor cores' said TAP to be externally knowable from said multi-core processor.

12. The apparatus of claim 11, wherein said test control mechanism is arranged to allow only one of said at least two processor cores' said TAP to be externally visible from said multi-core processor.

13. The apparatus of claim 11, wherein said test control mechanism is arranged to allow the selection of which at least one of said at least two processor cores' said TAP is externally visible from said multi-core processor to occur dynamically.

14. The apparatus of claim 8, wherein said test control mechanism is coupled to produce during operation an error signal if the output signals of said at least two processor cores' said TAP are not substantially equivalent.

15. The apparatus of claim 2, wherein said test control mechanism, at least one processor core and said at least one circuit comprising non-processor core logic are further coupled so as to allow testing of said at least one circuit comprising non-processor core logic.

16. A system comprising:
    a computing platform, including:
      a memory to store instructions;
      a multi-core processor to process instructions, said multi-core processor including:
        a test control mechanism,
        a plurality of processor cores,
        at least one circuit comprising non-processor core logic, and
        wherein at least one processor core includes a test access port controller (TAPC), a plurality of distributed data registers and a plurality of distributed control registers; and
    said multi-core processor and said test control mechanism having a configuration so as to allow testing of said plurality of processor cores, said test control mechanism tests more than one processor core of the plurality of processor cores concurrently.

17. A method comprising:
    providing an indicator to identify a desired testing option;
    based upon said desired testing option, dynamically routing signals between a plurality of test access ports (TAPs) during testing,
    wherein said plurality of TAPs are part of a multi-core processor; and
    said multi-processor core including a plurality of processor cores,
    wherein at least one processor core includes a test access port controller (TAPC), a plurality of distributed data registers and a plurality of distributed control registers.

18. The method of claim 17, wherein the routing of said signals is selected from a group consisting essentially of coupling said test access ports substantially in series, coupling said test access ports substantially in parallel, and coupling said test access ports for substantially independent operation.

19. The method of claim 18, wherein providing an indicator to identify a desired testing option comprises storing control information in a register.

20. The method of claim 19, wherein storing control information in a register comprises a step in compliance with the operation of test data registers as described in the IEEE 1149.1 specification.

21. The method of claim 17, wherein dynamically routing signals between said plurality of TAPs comprises dynamically routing signals between said TAPC and said plurality of distributed data registers and said plurality of control registers.

22. The method of claim 17, wherein dynamically routing signals between said plurality of TAPs comprises only altering the routing of signals external to said plurality of processor cores.

23. The method of claim 17, which further comprises producing a signal that indicates whether the output signals of said at least two processor cores' said plurality of TAPs are equivalent or substantially equivalent.

* * * * *